(12) United States Patent
Tsuchimoto

(10) Patent No.: US 10,677,838 B2
(45) Date of Patent: Jun. 9, 2020

(54) ABNORMALITY DETECTOR FOR ELECTRONIC DEVICE

(71) Applicant: FANUC CORPORATION, Yamanashi (JP)

(72) Inventor: Masataka Tsuchimoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/173,047

(22) Filed: Oct. 29, 2018

(65) Prior Publication Data

US 2019/0154752 A1    May 23, 2019

(30) Foreign Application Priority Data

Nov. 22, 2017 (JP) ................. 2017-224378

(51) Int. Cl.
*G01R 31/28* (2006.01)
*H05K 1/02* (2006.01)

(52) U.S. Cl.
CPC ..... *G01R 31/2818* (2013.01); *G01R 31/2808* (2013.01); *G01R 31/2813* (2013.01); *H05K 1/0268* (2013.01)

(58) Field of Classification Search
CPC ............ G01R 31/2808; G01R 31/2813; G01R 31/2818; H05K 1/0268
(Continued)

(56) References Cited

U.S. PATENT DOCUMENTS 3,870,953 A * 3/1975 Boatman .......... G01R 31/31915
                                          324/72.5
4,541,386 A * 9/1985 Kishi .................... F02D 41/222
                                          123/479

(Continued)

FOREIGN PATENT DOCUMENTS

DE    2748529 A1    5/1978
DE    3686697 T2    4/1993
(Continued)

OTHER PUBLICATIONS

Office Action issued in JP 2017-224378; mailed by the Japanese Patent Office dated Jul. 16, 2019.
(Continued)

*Primary Examiner* — Patrick Assouad
*Assistant Examiner* — Demetrius R Pretlow
(74) *Attorney, Agent, or Firm* — Studebaker & Brackett PC

(57) ABSTRACT

An abnormal state latch unit comprises: an detection circuit that masks an abnormality position signal; a timer circuit that starts motion when the abnormality position signal indicates the occurrence of an abnormality based on the abnormality position signal, and completes the motion and outputs a reset signal after passage of a predetermined period; and a latch circuit that latches the abnormality position signal output from the detection circuit when the reset signal is output. The detection circuit masks the abnormality position signal when the latch circuit makes latching motion to disable an output from the detection circuit. The timer circuit masks an input to the timer circuit when the latch circuit makes the latching motion to maintain a state indicating completion of the motion. Abnormality voltage signals generated by an signal generation circuit are wired-OR connected and supplied through a single signal line to a monitor circuit.

6 Claims, 6 Drawing Sheets

(58) Field of Classification Search
USPC .................................. 324/763.01–763.02
See application file for complete search history.

(56) References Cited

U.S. PATENT DOCUMENTS

| | | | | |
|---|---|---|---|---|
| 5,485,094 | A * | 1/1996 | Endoh | G01R 31/318371 |
| | | | | 324/527 |
| 5,757,193 | A * | 5/1998 | Yu | G01R 31/309 |
| | | | | 250/559.45 |
| 6,028,431 | A * | 2/2000 | Hashida | G06F 11/2221 |
| | | | | 324/537 |
| 6,075,688 | A * | 6/2000 | Willard | H02H 1/003 |
| | | | | 361/115 |
| 7,250,781 | B2 * | 7/2007 | Nakagawa | G01R 31/281 |
| | | | | 324/756.05 |
| 7,933,101 | B2 * | 4/2011 | Bourgeau | H02P 9/006 |
| | | | | 361/21 |
| 2005/0017743 | A1 * | 1/2005 | Nakagawa | G01R 31/281 |
| | | | | 324/756.05 |
| 2009/0230977 | A1 * | 9/2009 | Vacar | G01R 31/2808 |
| | | | | 324/538 |
| 2011/0242989 | A1 * | 10/2011 | Kim | H04L 25/0266 |
| | | | | 370/242 |
| 2013/0057990 | A1 * | 3/2013 | Finlay, Sr. | H02H 3/338 |
| | | | | 361/50 |
| 2016/0202302 | A1 * | 7/2016 | Cooper | G01R 31/086 |
| | | | | 324/503 |

FOREIGN PATENT DOCUMENTS

| | | |
|---|---|---|
| DE | 19732113 C2 | 9/1999 |
| JP | S53-8003 A | 1/1978 |
| JP | S62-37015 A | 2/1987 |
| JP | H02-148296 A | 6/1990 |
| JP | H08-152925 A | 6/1996 |
| JP | 2001-306140 A | 11/2001 |
| JP | 2009-251356 A | 10/2009 |
| JP | 2011-123725 A | 6/2011 |
| JP | 2015-220966 A | 12/2015 |

OTHER PUBLICATIONS

An Office Action mailed by the German Patent and Trade Mark Office dated Mar. 11, 2020, which corresponds to German Patent Application No. DE 10 2018 008 623.3.

* cited by examiner

FIG. 5

ABNORMALITY VOLTAGE SIGNAL
ALM
V1 × 0.7
V2 × 0.6

↑ ABNORMALITY AT SECOND PRINTED BOARD
↑ LATCHING
↑ FLUCTUATION OF ALM VOLTAGE AFTER LATCHING

PERIOD WHEN TIMER CIRCUIT MAKES MOTION

Comp1 OUTPUT  L L H H H H H H H → H H H H L L L L

XOR1 OUTPUT  L L H L L L L L L → L L L H L L L L

AND1 OUTPUT  L L H L L L L L L → L L L L L L L L

Set1  H H H H H H H H H → H H H H H H H

Latch1  L L L L L L L L L → L L L L L L L

LED1  L L L L L L L L L → L L L L L L L

Comp2 OUTPUT  L L L H H H H H H → H H H L L L L

XOR2 OUTPUT  L L L H H H H H H → H H H L L L L

AND2 OUTPUT  L L L H H H H H H → L L L L L L L

Set2  H H H H H H H H L → H H H H H H H

Latch2  L L L L L L L L H → H H H H H H H

LED2  L L L L L L L L H → H H H H H H H

NOTIFY ABNORMALITY AT SECOND PRINTED BOARD (TURN ON LED2)

Reset  L L L L L L L L H → H H H H H H H
TIMER PERIOD

Mask  H H H H H H H H H → L L L L L L L

→ TIME

ABNORMALITY DETECTOR FOR ELECTRONIC DEVICE

This application is based on and claims the benefit of priority from Japanese Patent Application No. 2017-224378, filed on 22 Nov. 2017, the content of which is incorporated herein by reference.

BACKGROUND OF THE INVENTION

Field of the Invention

The present invention relates to as abnormality detector that detects an abnormality at an electronic device.

Related Art

In some conventional cases, to detect an abnormality at a printed board in an electronic device, an abnormality notification printed board has been used that receives abnormality signals from corresponding printed boards in a centralized manner. FIG. 6 is a conceptual view showing a configuration in which an abnormality notification printed board receives an abnormality signal output from a printed board as an abnormality inspection target. FIG. 6 shows printed boards as abnormality inspection targets including a first printed board 12a, a second printed board 12b, a third printed board 12c, and a fourth printed board 12d. The printed boards 12a to 12d output an abnormality signal ALM1, an abnormality signal ALM2, an abnormality signal ALM3, and an abnormality signal ALM4 respectively. The abnormality signal ALM1, the abnormality signal ALM2, the abnormality signal ALM3, and the abnormality signal ALM4 are digital signals. The abnormality notification printed board 20 receives these four abnormality signals (ALM1, ALM2, ALM3, and ALM4). In response to assertion of any of these abnormality signals, the abnormality notification printed board 20 can determine a printed board where an abnormality has been detected (a position where the abnormality has been detected). Then, the abnormality notification printed board 20 notifies the abnormality to the outside (to a user or an officer, for example) by taking various methods.

The abnormality notification printed board 20 includes an abnormal state latch unit 22 and an abnormality notification unit 24. The abnormal state latch unit 22 latches an asserted abnormality signal. The abnormality notification unit 24 can detect a position where an abnormality has occurred (abnormality position) based on the latched abnormality signal. The abnormality notification unit 24 notifies the occurrence of the abnormality and the abnormality position together to the outside. In this way, on the occurrence of an abnormality at an electronic device, the occurrence of the abnormality can be notified to the outside (to a user or an officer, for example).

In many cases, the configuration shown in FIG. 6 is provided in an electronic device. The reason for this is that the first to fourth printed boards 12a to 12d as abnormality inspection targets form part of this electronic device. Meanwhile, the abnormality notification printed board 20 may be provided outside the electronic device as an abnormality inspection target. As clearly understood from FIG. 6, the number of signal lines for transmitting abnormality signals should be responsive to the number of printed boards as abnormality detection targets. This has caused a problem that increase in the number of printed boards as detection targets necessitates increase in the number of signal lines to be responsive to the increased number of printed boards.

Patent document 1 mentioned below discloses an abnormality determination circuit capable of reducing the number of wires. Patent document 2 mentioned below discloses a technique allowing detection of the rotation speeds of multiple cooling fans using a single detection signal, and a technique allowing identification of a failed fan. Patent document 3 mentioned below discloses a monitor system that notifies an abnormality at a power supply system, particularly, a system avoiding troublesome work necessitated in confirming a notification content. Patent document 4 mentioned below discloses a technique allowing extraction of an abnormality detected initially that as to become a cause for halt of a device to be monitored.

Patent Document 1: Japanese Unexamined Patent Application, Publication No. H08-152925
Patent Document 2: Japanese Unexamined Patent Application, Publication No. 2009-251356
Patent Document 3: Japanese Unexamined Patent Application, Publication No. 2015-220966
Patent Document 4: Japanese Unexamined Patent Application, Publication No. 2001-306140

SUMMARY OF THE INVENTION

In a conventional electronic device, more signal lines for transmitting abnormality signals are required in response to increase in the number of positions where abnormalities are to be detected or increase in the number of printed boards where abnormalities are to be detected. This has complicated the electronic device and has caused a problem that, in response to increase in the number of positions where abnormalities are to be detected, the number of wires for transmitting abnormality signals is increased to result in a more complicated configuration of the device.

The present invention has been made in view of the foregoing problems, and is intended to provide an abnormality detector for an electronic device that achieves reduced wiring by suppressing increase in the number of signal lines for transmitting abnormalities at the electronic device.

First, the present inventor has come up with a technical idea of reducing the number of signal lines by wired-OR connecting signal lines for transmitting abnormality signals indicating the occurrences of abnormalities. By changing the voltage value of an abnormality signal between abnormality positions, an abnormality position where an abnormality has occurred can be identified based on a voltage value. Second, the present inventor has come up with a technical idea of providing means employed in on the occurrences of multiple abnormalities. This means is to latch an abnormality signal based on an initial abnormality after passage of a predetermined period from the occurrence of the abnormality, and mask an abnormality having occurred after the latching.

Based on the foregoing technical ideas, the present inventor has found that it becomes possible to prevent erroneous detection due to noise, or to prevent the voltage fluctuation of an abnormality signal output by the occurrence of an abnormality from being detected (erroneously) while the voltage fluctuates after the abnormality signal is asserted. Based on the foregoing technical ideas, the present inventor has found that, by masking abnormalities (a second abnormality and a third abnormality (abnormality signals about these abnormalities)) having occurred after the occurrence of an initial abnormality, an initial abnormality signal can be identified without using particular recording means for recording a position where the initial abnormality has occurred, etc. The present inventor has completed the present invention by devising the foregoing technical ideas. A specific configuration of the present invention will be descried next.

(1) An abnormality detector for an electronic device according to the present invention (abnormality detector 100 described later, for example) comprises: an abnormality detection unit (abnormality detection unit 110 described later, for example) that outputs an abnormality position signal for identifying an abnormality position on the occurrence of an abnormality at the electronic device; an abnormal state latch unit (abnormal state latch unit 200 described later, for example) that latches the abnormality position signal; and an abnormality notification unit (abnormality notification unit 300 described later, for example) that notifies the abnormality based on the latched abnormality position signal. The abnormality detection unit comprises: an abnormality voltage signal generation circuit (abnormality voltage signal generation unit 114 described later, for example) that converts abnormality signals indicating the occurrences of abnormalities at predetermined abnormality positions to voltages differing between the abnormality positions to generate abnormality voltage signals about corresponding ones of the abnormality positions; and a voltage monitor circuit (voltage monitor circuit 116 described later, for example) that monitors the abnormality voltage signals generated by the abnormality voltage signal generation circuit, and outputs the abnormality position signal for identifying the abnormality position based on the voltages corresponding to the abnormality voltage signals. The abnormal state latch unit comprises: an abnormal state detection circuit (abnormal state detection circuit 202 described later, for example) that masks the abnormality position signal; a timer circuit (timer circuit 206 described later, for example) that starts motion when the abnormality position signal indicates the occurrence of an abnormality based on the abnormality position signal, and completes the motion and outputs a reset signal after passage of a predetermined period; and a latch circuit (latch circuit 204 described later, for example) that latches the abnormality position signal output from the abnormal state detection circuit when the reset signal is output. The abnormal state detection circuit masks the abnormality position signal when the latch circuit makes latching motion to disable an output from the abnormal state detection circuit. The timer circuit masks an input to the timer circuit when the latch circuit makes the latching motion to maintain a state indicating completion of the motion. The abnormality voltage signals about corresponding ones of the abnormality positions generated by the abnormality voltage signal generation circuit are wired-OR connected and supplied through a single signal line to the voltage monitor circuit.

(2) In the invention described in (1), the abnormality voltage signal generation circuit may comprise: an inspection target printed board unit provided at a printed board as an abnormality inspection target; and an abnormality notification printed board unit provided at an abnormality notification printed board to notify an abnormality. The inspection target printed board unit may comprise: output resistors (output resistors 152*a* to 152*d* described later, for example) having resistances differing between the abnormality signals; and switch circuits (transistors 150*a* to 150*d* described later, for example) for making electrical conductions between the output resistors and the ground if the abnormality signals are on. The abnormality notification printed board unit may comprise a pull-up resistor (pull-up resistor 154 described later, for example) connected between the output resistors arranged at the printed board as an inspection target and a power supply voltage.

(3) In the invention described in (1) or (2), if an input filter is provided for removal of noise from the abnormality signals, the predetermined period may be longer than time constant of the input filter.

(4) In the invention described in (1) or (2), if the electronic device is to be powered off based on the abnormality signals, the predetermined period may be shorter than a period from when the abnormality signals are switched on to when the electronic signal is powered off.

(5) In the invention described in any one of (1) to (4), the abnormality notification unit may comprise a light-emitting unit (LED1, LED2 described later, for example) to be turned on corresponding to each abnormality position and based on the latched abnormality position signal.

(6) In the invention described in any one of (1) to (4), the abnormality notification unit may comprise a display unit to display an abnormality position based on the latched abnormality position signal.

According to the present invention, increase in the number of signal lines for transmitting abnormality signals can be suppressed. According to the present invention, further, erroneous detection of an abnormality due to noise superimposed on an abnormality signal can be prevented. According to the present invention, further, an abnormality signal generated initially can be identified.

BRIEF DESCRIPTION OF THE DRAWINGS

FIG. 5 is a state transition view showing a second example of the motion of the abnormality detector according to the embodiment of the present invention.

DETAILED DESCRIPTION OF THE INVENTION

An embodiment of the present invention will be described below based on the drawings.

First Embodiment

[1. Principles]

Figure 1:
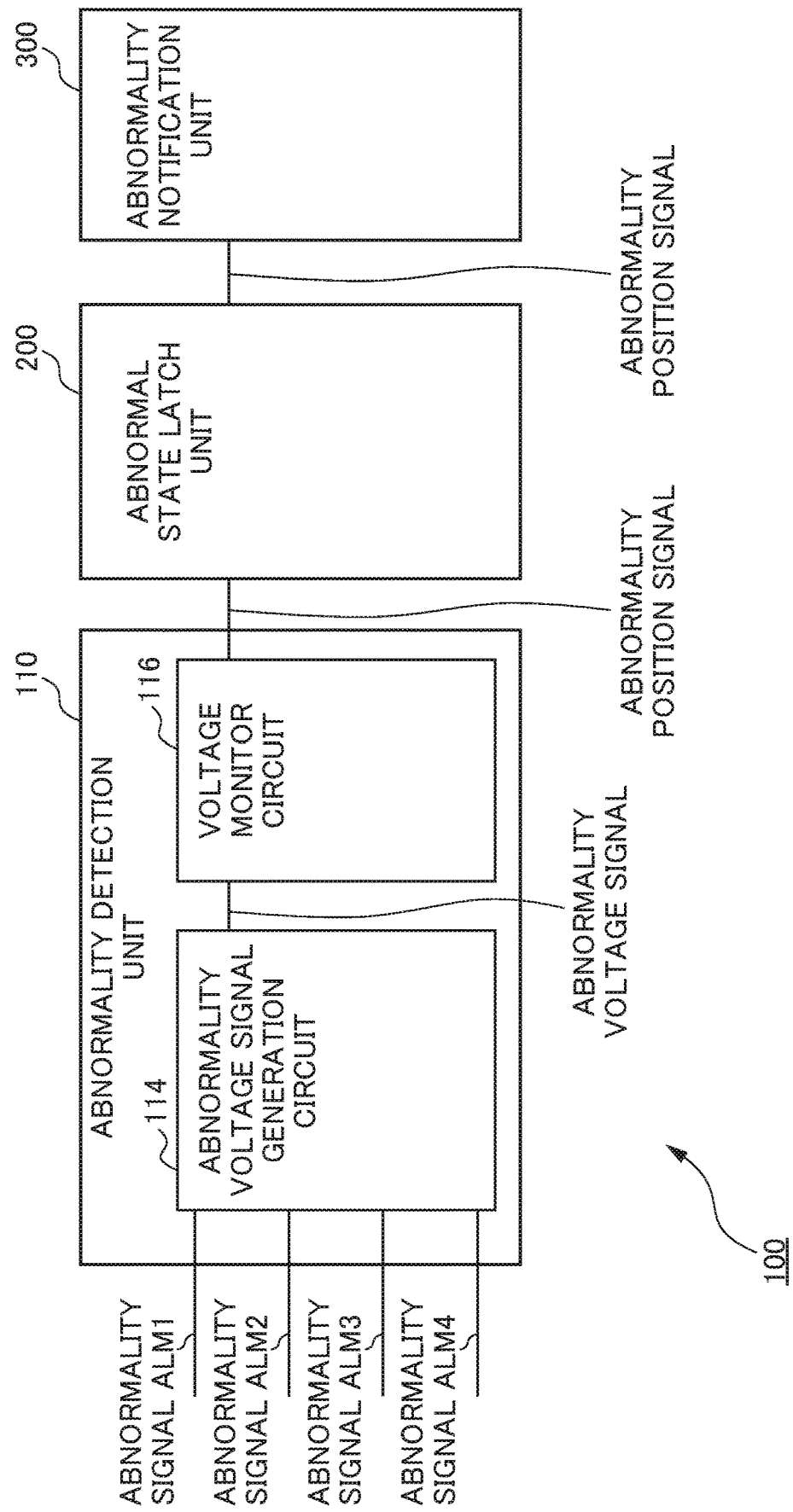
FIG. 1 is a configuration view showing the principles of an abnormality detector of the present invention.
Figure 6:
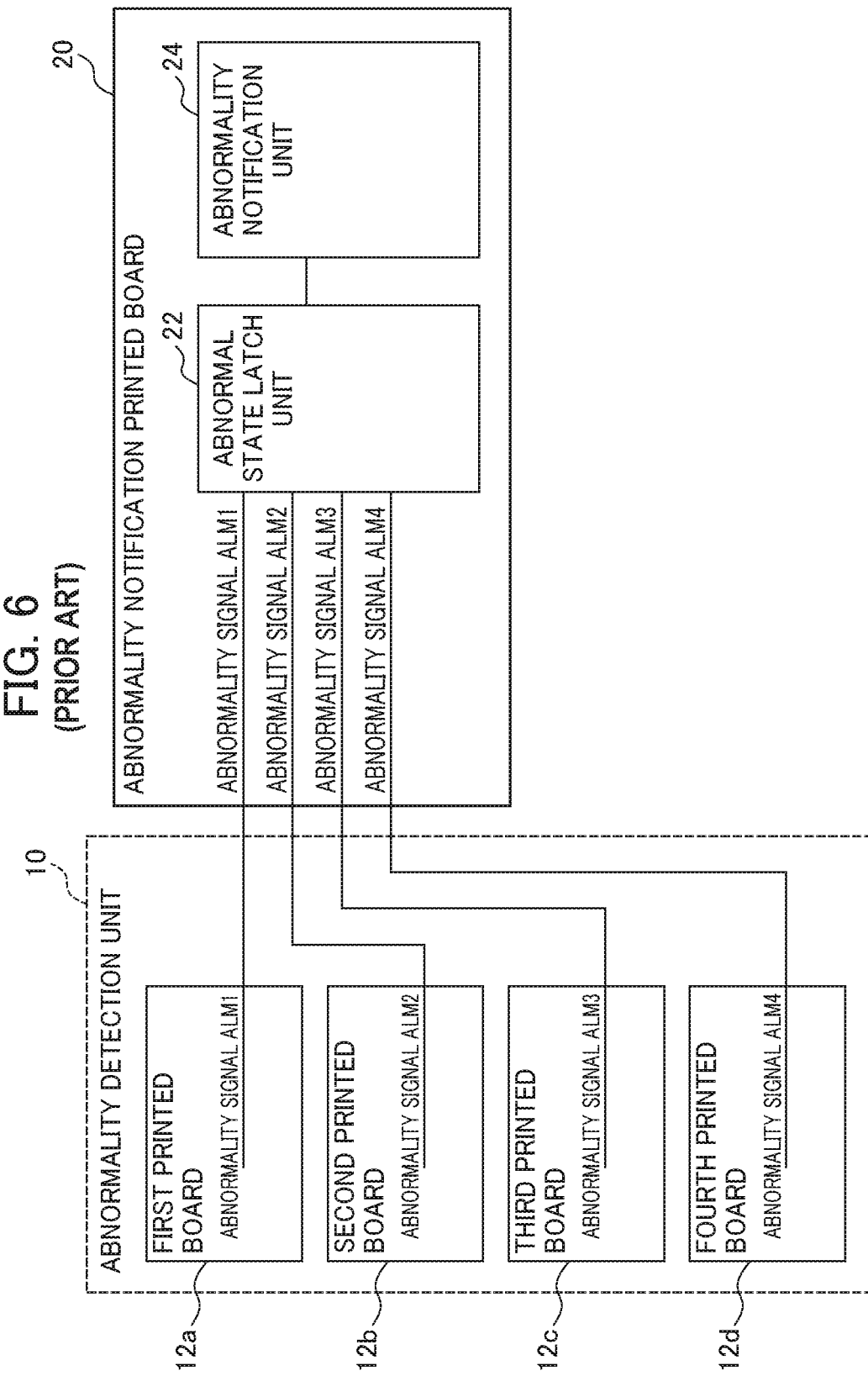
FIG. 6 is an explanatory view showing the principles of conventional detection of an abnormality signal.

FIG. 1 is a configuration view showing the principles of an abnormality detector 100 of a first embodiment. First, like in conventional cases, an abnormality signal is output if an abnormality is detected at an abnormality inspection target. Like in FIG. 6, four types of signals including an abnormality signal ALM1, an abnormality signal ALM2, an abnormality signal ALM3, and an abnormality signal ALM4 are used in the illustration of FIG. 1. These signals may be indicative of abnormalities occurring at corresponding four printed boards like in FIG. 6, for example, or may be signals indicative of abnormalities occurring at any positions. As shown in FIG. 1, the abnormality detector 100 includes an abnormality detection unit 110, an abnormal state latch unit 200, and an abnormality notification unit 300 as principal structures.

[Abnormality Detection Unit 110]

The abnormality detection unit 110 receives the abnormality signal ALM1, the abnormality signal ALM2, the abnormality signal ALM3, and the abnormality signal ALM4, and outputs an abnormality position signal. The abnormality detection unit 110 includes an abnormality voltage signal generation circuit 114 and a voltage monitor circuit 116.

The abnormality voltage signal generation circuit 114 receives the abnormality signal ALM1, the abnormality signal ALM2, the abnormality signal ALM3, and the abnormality signal ALM4. If an abnormality is detected, any of the abnormality signals (any of ALM1 to ALM4) is asserted (switched on). Then, the abnormality voltage signal generation circuit 114 generates an abnormality voltage signal as a voltage signal corresponding to the asserted one of the abnormality signals ALM1 to ALM4. Specifically, while the abnormality signal ALM1, the abnormality signal ALM2, the abnormality signal ALM3, and the abnormality signal ALM4 are digital signals, the abnormality voltage signal generation circuit 114 converts information in each of these signals to an abnormality voltage signal as an analog signal. The abnormality voltage signal can be indicative of which one of the abnormality signals has been asserted (has been switched on) using a voltage corresponding to this abnormality voltage signal. In this way, a position where an abnormality has occurred can be indicated.

The voltage monitor circuit 116 receives an abnormality voltage signal, can detect a position where an abnormality has occurred (abnormality position), and outputs an abnormality position signal indicating the abnormality position. Specifically, the voltage monitor circuit 116 discriminates a voltage an the abnormality voltage signal as an analog signal, and generates an abnormality position signal. More specifically, the voltage monitor circuit 116 generates an abnormality position signal by identifying a voltage using a comparator, for example, and outputs the generated abnormality position signal.

[Abnormal State Latch Unit 200]

The abnormal state latch unit 200 latches an abnormality position signal. The abnormality position signal is latched for the reason that holding a position where an abnormality has occurred makes it possible to examine a factor for the occurrence of the abnormality easily. Each of the abnormality signals ALM1 to ALM4 is to be asserted (switched on) on the occurrence of an abnormality. The asserted signal is likely to become unstable due to the occurrence of the abnormality. Additionally, in many cases, a subsequent abnormality may occur as chain reaction. In this case, it becomes difficult to determine a cause for the abnormalities. For this reason, holding (latching) the abnormality (the position of the abnormality) having occurred initially makes it possible to determine an abnormality as a root cause easily. Thus, the abnormality position signal resulting from the abnormality having occurred initially is latched.

[Abnormality Notification Unit 300]

The abnormality notification unit 300 notifies an abnormality and the position of the abnormality together based on a latched abnormality position signal. The abnormality and the position of the abnormality may be notified to any destination. The abnormality notification unit 300 may notify the abnormality and the position of the abnormality to a user or an officer, or may transmit the notification to the outside through a network such as the Internet. The abnormality notification unit 300 may transmit the notification to a remote management server for this electronic device, for example. For notification to a user, the abnormality notification unit 300 may turn on an LED for the notification, for example. An LED to be turned on or the color of emitted light may be changed in response to the position of an abnormality. The abnormality notification unit 300 preferably notifies a user of an abnormality by means of an audible alarm or voice. The abnormality notification unit 300 may present an abnormality position, etc. on a predetermined display, for example. In this case, the LED corresponds to a preferred example of a "light-emitting unit" of the present invention, and the display corresponds to a preferred example of a "display unit" of the present invention, for example.

[2. Relationship with Printed Board, and Others]

[Relationship with Electronic Device]

The configuration of the abnormality detector 100 shown in FIG. 1 is preferably arranged inside an electronic device as an inspection target. Alternatively, part of the configuration may be provided outside the electronic device. Specifically, the abnormality detector 100 according to the first embodiment may be provided inside the electronic device to be inspected. Alternatively, the abnormality detector 100 may be provided outside the electronic device, and the abnormality detector 100 and the electronic device may be connected through a predetermine signal line. Still alternatively, the abnormality detector 100 may be configured in such a manner that only the abnormal state latch unit 200 or the abnormality notification unit 300 is attached to the outside of an electronic device, for example. By contrast, the abnormality detection unit 110 is preferably arranged inside an electronic device to generate an abnormality signal and near a position where the abnormality signal is generated.

[Relationship with Printed Board]

Figure 2:
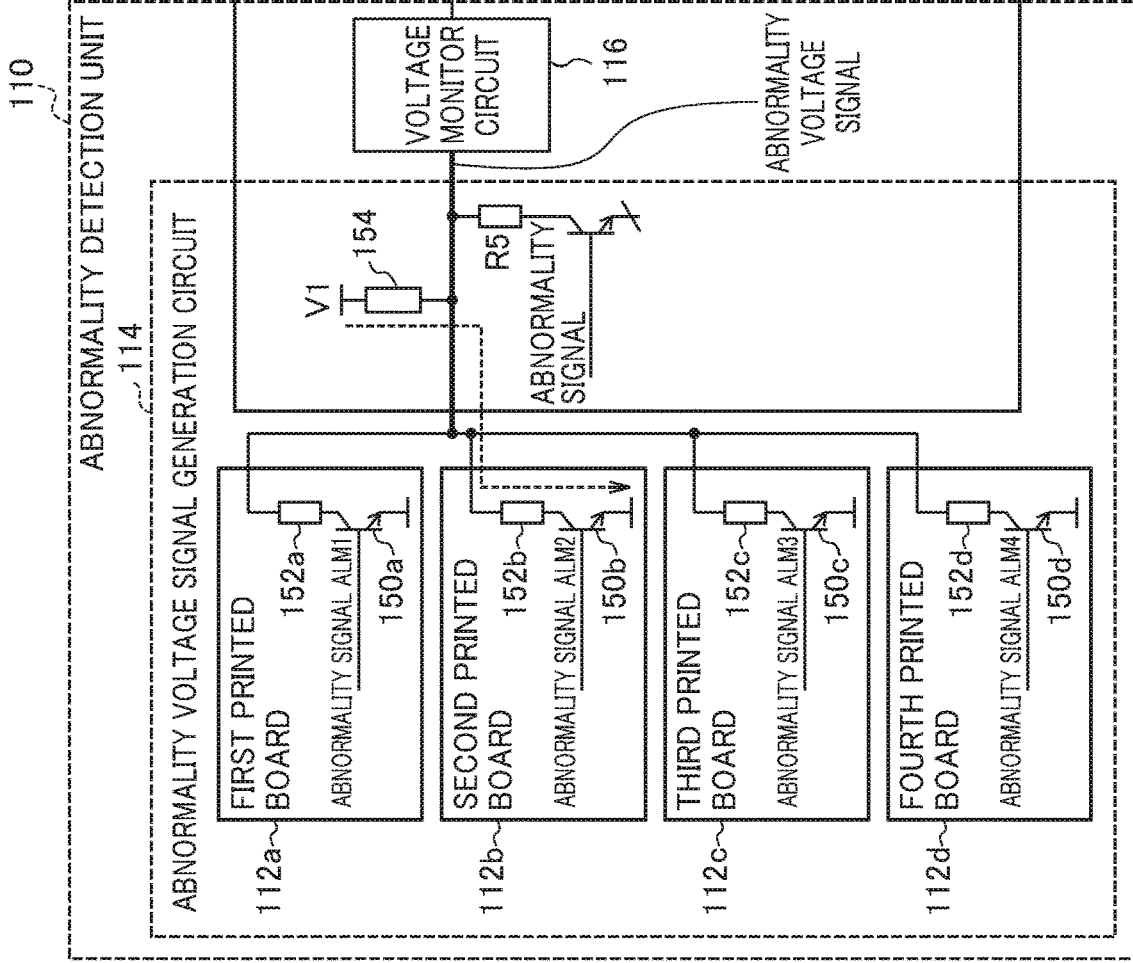
FIG. 2 is a configuration view showing the configuration of an abnormality detector according to an embodiment of the present invention.

The configuration of the abnormality detector 100 shown in FIG. 1 is also preferably arranged at any position on a printed board in an electronic device as an inspection target. Meanwhile, in many cases, preferable arrangement of the abnormality detection unit 110 (in particular, the abnormality voltage signal generation circuit 114 in the abnormality detection unit 110) to receive the abnormality signals ALM1 to ALM4 is considered to be near printed boards where abnormalities are to be detected and from which the abnormality signals ALM1 to ALM4 are to be transmitted. FIG. 2 shows a preferred example of a relationship between each structure in the abnormality detector 100 shown in FIG. 1 and printed boards in an electronic device. In the illustration of FIG. 2, the electronic device includes a first printed board 112a, a second printed board 112b, a third printed board 112c, and a fourth printed board 112d for fulfilling the function of the electronic device, and an abnormality notification printed board 120 for abnormality notification.

[Arrangement of Abnormality Detection Unit 110]

In the illustration of FIG. 2, the abnormality voltage signal generation circuit 114 in the abnormality detection unit 110 is arranged to stretch over the first printed board 112a, the second printed board 112b, the third printed board 112c, and the fourth printed board 112d for fulfilling the inherent function of the electronic device, and the abnormality notification printed board 120.

[a. Printed Board Unit]

As shown in FIG. 2, a transistor 150a capable of being turned on by an abnormality signal, and an output resistor 152a connected to one end of the transistor 150a, are arranged on the first printed board 112a as an inspection target. The transistor 150a has an opposite end connected to the ground. By doing so, the output resistor 152a and the ground become electrically conductive. Specifically, the transistor 150a corresponds to a preferred example of a "switch circuit" of the present invention, and the output resistor 152a corresponds to a preferred example of an "output resistor" of the present invention.

A transistor 150b capable of being turned on by an abnormality signal, and an output resistor 152b connected to one end of the transistor 150b, are arranged on the second printed board 112b as an inspection target. The transistor 150b has an opposite end connected to the ground. By doing so, the output resistor 152b and the ground become electrically conductive.

A transistor 150c capable of being turned on by an abnormality signal, and an output resistor 152c connected to one end of the transistor 150c, are arranged on the third printed board 112c as an inspection target. The transistor 150c has an opposite end connected to the ground. By doing so, the output resistor 152c and the ground become electrically conductive.

A transistor 150d capable of being turned on by an abnormality signal, and an output resistor 152d connected to one end of the transistor 150d, are arranged on the fourth printed board 112d as an inspection target. The transistor 150d has an opposite end connected to the ground. By doing so, the output resistor 152d and the ground become electrically conductive.

The output resistors 152a, 152b, 152c, and 152d have resistances differing from each other. By the presence of the different resistances, the abnormality voltage signal generation circuit 114 is allowed to generate abnormality voltage signals having different voltage values using asserted (switched on) abnormality signals. Thus, an asserted abnormality signal can be detected easily by checking the voltage value of an abnormality voltage signal. The foregoing transistors 150a, 150b, 150c, and 150d, and the foregoing output resistors 152a, 152b, 152c, and 152d each correspond to a preferred example of an "inspection target printed board unit" of the present invention.

[b. Abnormality Notification Printed Board Unit]

As shown in FIG. 2, a pull-up resistor 154 having one end connected to a power supply is arranged on the abnormality notification printed board 120 for abnormality notification as a printed board. The pull-up resistor 154 has an opposite end connected to the foregoing output resistors 152a, 152b, 152c, and 152d (see FIG. 2). In this configuration, assertion of one abnormality signal allows generation of a signal having a voltage determined by a ratio in resistance between one of the output resistors 152a to 152d connected to the asserted abnormality signal and the pull-up resistor 154. This signal is an abnormality voltage signal (see FIG. 2).

The pull-up resistor 154 corresponds to a preferred example of a "pull-up resistor" of the present invention, and also corresponds to a preferred example of an "abnormality notification printed board unit" of the present invention. In this configuration, abnormality signals are wired-OR connected and then connected to the abnormality notification printed board 120. Thus, only one signal line is required for these abnormality signals (specifically, a single signal line is sufficient). The number of signal lines to be used is not required to be responsive to the number of printed circuit boards (in the illustration of FIG. 2, four) but only a single signal line is sufficient, thereby contributing to reduced wiring.

[Arrangement of Voltage Monitor Circuit 116]

In the illustration of FIG. 2, the voltage monitor circuit 116 is arranged on the abnormality notification printed board 120. The voltage monitor circuit 116 converts an abnormality voltage signal to an abnormality position signal indicating a position where an abnormality is detected.

[Arrangement of Abnormal State Latch Unit 200]

In the illustration of FIG. 2, the abnormal state latch unit 200 is arranged on the abnormality notification printed board 120. As shown in FIG. 2, the abnormal state latch unit 200 includes: an abnormal state detection circuit 202 that masks an abnormality position signal; a latch circuit 204 that latches the abnormality position signal based on a reset signal output from a timer circuit; and a timer circuit 206 that starts motion from when the abnormality position signal is output to indicate the occurrence of an abnormality, and completes the motion and outputs a reset signal (is turned on) after passage of a predetermined period.

The abnormal state latch unit 200 is characterized in that the abnormal state latch unit 200 does not latch an abnormality position signal immediately after the abnormality position signal indicates the occurrence of an abnormality but it latches the abnormality position signal after pass age of the predetermined period. As a result, on the occurrences of multiple abnormalities, the abnormal state latch unit 200 latches an initial abnormality signal (abnormality position signal) after passage of the predetermined period from the occurrence of an abnormality, and masks a subsequent abnormality. In this way, the abnormal state latch unit 200 latches an abnormality after passage of the predetermined period from the occurrence of the abnormality. This makes it Possible to prevent erroneous detection due to noise superimposed on an abnormality signal or other signals. This also makes it possible to prevent the voltage fluctuation of an abnormality signal due to the occurrence of an abnormality from being detected (erroneously) during the fluctuation. The occurrence of the abnormality means that motion deviates from normal motion, so that various types of irregular situation are generally considered to occur.

The timer circuit 206 starts motion from when an abnormality position signal indicates the occurrence of an abnormality. After passage of the predetermined period, the timer circuit 206 outputs a reset signal (is turned on). Based on this reset signal, the latch circuit 204 latches the abnormality position signal, thereby achieving the foregoing effect. The latch circuit 204 latches the abnormality position signal after passage of the predetermined period as described above, and supplies the latched abnormality position signal to the abnormality notification unit 300.

The abnormal state detection circuit 202 masks an abnormality position signal when the latch circuit latches the abnormality position signal to disable an output (produce a state without an abnormality). This allows elimination of influence by noise, etc. The predetermined period can be determined in various ways in a manner that depends on an electronic device to be used. For example, the predetermined period is preferably in a range from about 50 μsec to about 200 μsec. However, the predetermined period can be shorter or longer than this range. In a different example, in the presence of an input filter circuit for removal of noise from an abnormality signal, the predetermined period is preferably longer than the time constant of the input filter. In a still different example, if an electronic device is to be powered off based on an abnormality signal, the predetermined period is preferably shorter than a period from when the abnormality signal is switched on to when the electronic device is powered off.

[Arrangement of Abnormality Notification Unit 300]

In the illustration of FIG. 2, the abnormality notification unit 300 is arranged on the abnormality notification printed board 120. As shown in FIG. 2, the abnormality notification unit 300 notifies an abnormality based on an abnormality position signal latched by the latch circuit 204 in the abnormal state latch unit 200. A person and a location to receive the notification are not limited. The notification may be given using various types of methods. For example, LEDs responsive to various types of abnormalities may be turned on. Alternatively, an abnormality may be transmitted through the Internet to a remote management device. Still alternatively, an abnormality may be notified by sound or may be presented on a display. The example of the arrangement shown in FIG. 2 is one of preferred examples. Different arrangement of printed boards is applicable. For example, printed boards may be standardized into one. Alternatively, the number of printed boards may be increased by dividing one printed board.

[3. Specific Example of Circuit]

Figure 3:
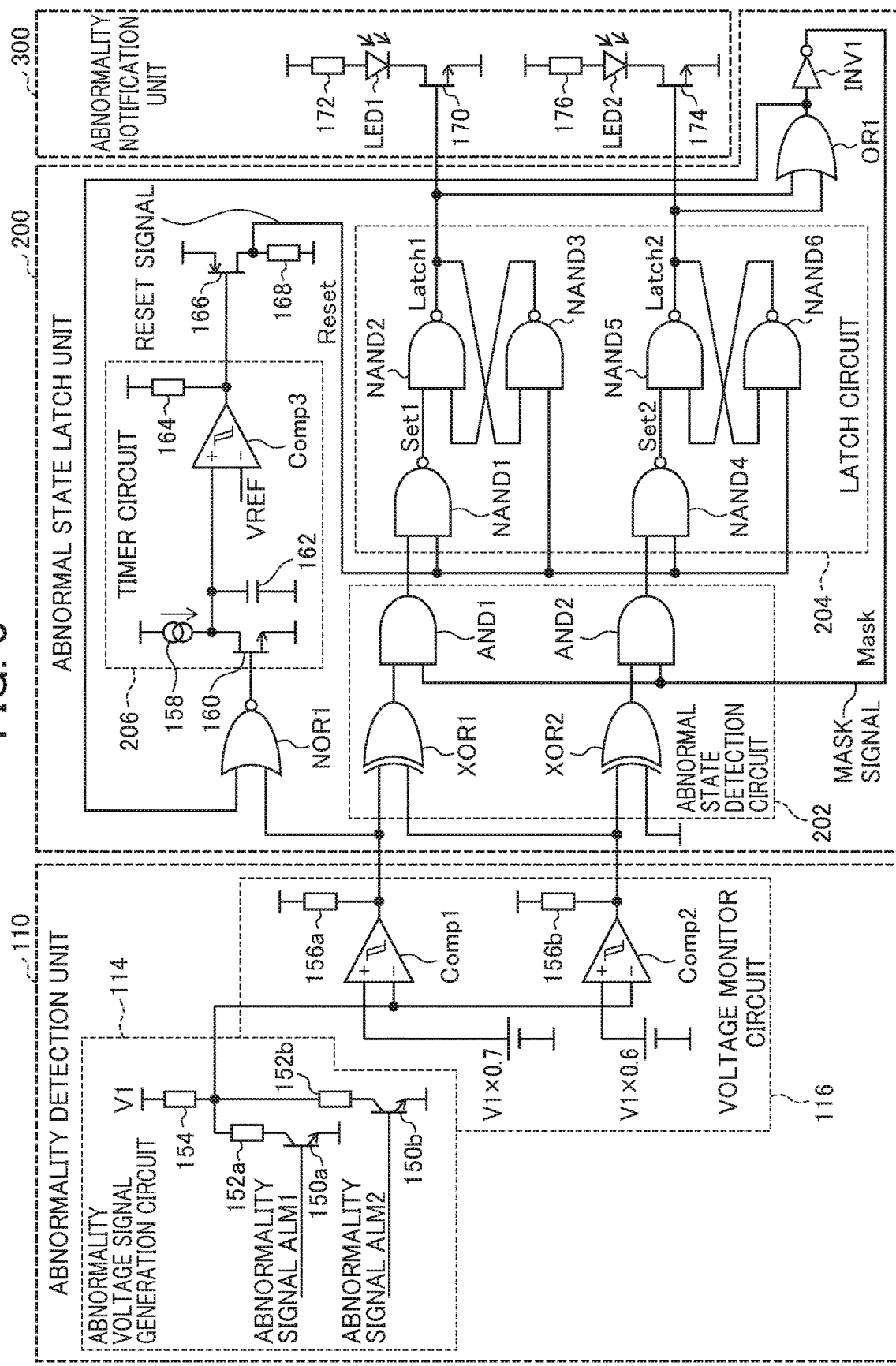
FIG. 3 is a circuit diagram of the abnormality detector according to the embodiment of the present invention.

FIG. 3 shows an example of a circuit of the abnormality detector 100. In the illustration of FIG. 3, to facilitate description, only components relating to two types of abnormality signal, specifically, components relating to the abnormality signal ALM1 and the abnormality signal ALM2 are shown. The circuit may actually include more abnormality signals such as the abnormality signal ALM3, the abnormality signal ALM4, and other abnormality signals. Examples of the motion of the circuit shown in FIG. 3 are shown in the timing diagrams in FIGS. 4 and 5.

[Abnormality Detection Unit 110]

As shown in FIG. 3, the abnormality voltage signal generation circuit 114 in the abnormality detection unit 110 includes the transistor 150a to be turned on by the abnormality signal ALM1, and the output resistor 152a. The abnormality voltage signal generation circuit 114 includes the transistor 150b to be turned on by the abnormality signal ALM2, and the output resistor 152b. The abnormality voltage signal generation circuit 114 includes the pull-up resistor 154. These components have already been described by referring to FIG. 2. Referring to FIG. 3, V1 shows a power supply voltage. As is also shown in FIG. 2, a signal appearing at a node between the pull-up resistor 154 and each of the output resistors 152a and 152b is an abnormality voltage signal. Next, as shown in FIG. 3, the voltage monitor circuit 116 in the abnormality detection unit 110 discriminates a voltage in the abnormality voltage signal, and determines whether the abnormality signal ALM1 has been asserted (switched from L level to H level) or the abnormality signal ALM2 has been asserted (switched from L level to H level).

As described above, the output resistor 152a and the output resistor 152b have different resistances. These resistances are set in such a manner that, if the abnormality signal ALM1 is asserted, an abnormality voltage signal becomes about 0.65×V1 volts, and if the abnormality signal ALM2 is asserted, an abnormality voltage signal becomes about 0.55× V1 volts. In this embodiment, the assertion of the abnormality signal ALM1 means that an abnormality has occurred at the first printed board 112a, and the assertion of the abnormality signal ALM2 means that an abnormality has occurred at the second printed board 112b. These abnormality signals may indicate abnormalities at different positions.

The voltage monitor circuit 116 includes a comparator Comp1 and a comparator Comp2 for inspection of the voltage of an abnormality voltage signal (see FIG. 3). The comparator Comp1 compares an abnormality voltage signal with 0.7×V1. If the abnormality voltage signal is lower than 0.7×V1, the comparator Comp1 produces an output H. The comparator Comp2 compares the abnormality voltage signal with 0.6×V1. If the abnormality voltage signal is lower than 0.6×V1, the comparator Comp2 produces an output H. An output from the comparator Comp1 and an output from the comparator Comp2 are connected to a pull-up resistor 156a and a pull-up resistor 156b respectively to be pulled up to a power supply voltage. In this circuit configuration, an output signal from the comparator Comp1 and an output signal from the comparator Comp2 are expressed as follows:

(1) if the abnormality signal ALM1 is asserted (if an abnormality has occurred to produce an output signal H)

An output signal from the comparator Comp1=H
An output signal from the comparator Comp2=L If the abnormality signal ALM2 is asserted (if an abnormality has occurred to produce an output signal H)

An output signal from the comparator Comp1=H
An output signal from the comparator Comp2=H The abnormality signal ALM1 and the abnormality signal ALM2 are not expected to be asserted simultaneously. The reason for this is that, regarding the occurrences of abnormalities, two types of abnormalities rarely occur at exactly the same time.

An output signal from the comparator Comp1 and an output signal from the comparator Comp2 are abnormality position signals and will particularly be called a first abnormality position signal. Regarding the first abnormality position signal, an output signal from the comparator Comp1 indicates the presence or absence of the occurrence of an abnormality, and an output signal from the comparator Comp2 indicates a position where an abnormality has occurred. Specifically, if the output signal from the Comparator Comp2 is H, this output signal shows the assertion of the abnormality signal ALM2 and the occurrence of an abnormality at the second printed board 112b. If the output signal from the Comparator Comp2 is L, this output signal shows the assertion of the abnormality signal ALM1 and the occurrence of an abnormality at the first printed board 112a. In the example described in this embodiment, two comparators Comp1 and Comp2 are used. Meanwhile, the number of comparators may be increased in response to increase in the number of abnormality signals. In this case, more reference voltages such as V1×0.5, V1×0.4, . . . may be used for comparison, for example.

[Abnormal State Latch Unit 200]

[Timer Circuit 206]

The timer circuit 206 receives an output signal supplied from the comparator Comp1 to become capable of determining whether an abnormality has occurred. The output signal from the comparator Comp1 is first supplied to an NOR gate NOR1. The NOR gate NOR1 further receives an output signal supplied from the latch circuit 204. If an abnormality has occurred while the latch circuit 204 does not latch an abnormality position signal, an output from the NOR gate NOR1 becomes H to turn on a transistor 160. Then, electrical charge in a capacitor 162 charged with a current from a constant current source 158 is released gradually to reduce a potential at the capacitor 162 gradually. A comparator Comp3 compares this potential at the capacitor 162 with Vref. If the potential at the capacitor 162 is reduced gradually to become lower than Vref, the comparator Comp3 produces an output L. The comparator Comp3 has an output terminal pulled up to a power supply potential through a pull-up resistor 164. If the output from the comparator Comp3 becomes L, a transistor 166 is turned on to set a reset signal to H. An output resistor 168 connected to the ground is connected to the transistor 166.

[Latch Circuit 204]

As described above, the timer circuit 206 sets a reset signal (see FIG. 3) to H after passage of the predetermined period from the occurrence of an abnormality. This reset signal is supplied to the latch circuit 204. The latch circuit 204 latches an abnormality position signal to coincide with time when the reset signal is set to H. This abnormality position signal to be latched is masked by the abnormal state detection circuit 202, and then supplied to the latch circuit 204. This abnormality position signal indicates the position where the abnormality has occurred. The abnormality notification unit 300 can notify a user, etc. of the abnormality using this abnormality position signal. The abnormality position signal output from the abnormal state detection circuit 202 is an abnormality position signal indicating an abnormality position and having a format different from an abnormality position signal (first abnormality position signal) output from the voltage monitor circuit 116. Thus, for the sake of convenience, the abnormality position signal output from the abnormal state detection circuit 202 will be called a second abnormality position signal. The second abnormality position signal is equal to the first abnormality position signal in terms of indicating an abnormality position and differs from the first abnormality position signal only in a format.

The first abnormality position signal indicates the presence or absence of an abnormality and the position of the abnormality as different signals. This allows the timer circuit 206 to start a timer in response to the occurrence of an abnormality independently of the position of the abnormality. Meanwhile, the second abnormality position signal is a signal prepared for each position where an abnormality has occurred in order to facilitate notification from the abnormality notification unit 300. The first abnormality position signal and the second abnormality position signal are converted by the abnormal state detection circuit 202. If an abnormality has occurred while the latch circuit 204 does not latch the second abnormality position signal, a mask signal becomes H and the abnormal state detection circuit 202 outputs an unmasked abnormality position signal (second abnormality position signal).

The second abnormality position signal output from the abnormal state detection circuit 202 is first supplied to a NAND gate NAND1 and a NAND gate NAND4 in the latch circuit 204. A reset signal is supplied to an opposite terminal of the NAND gate NAND1 and an opposite terminal of the NAND gate NAND4. Thus, when the timer circuit 206 sets the reset signal to H after passage of the predetermined period as described above, the NAND gate NAND1 and the NAND gate NAND4 invert the second abnormality position signal, and transmit the inverted abnormality position signals to their latter stages. An output signal from the NAND gate NAND1 is applied to a flip-flop including a NAND gate NAND2 and a NAND gate NAND3. The value of the output signal is reversed at this flip-flop, and the output signal is held at the reversed value. The held signal corresponds to a signal Latch1 shown in FIG. 3. The signal Latch1 is a signal to become H if the abnormality signal ALM1 is asserted.

An output signal from the NAND gate NAND4 is applied to a flip-flop including a NAND gate NAND5 and a NAND gate NAND6. The value of the output signal is reversed at this flip-flop, and the output signal is held at the reversed value. The held signal corresponds to a signal Latch2 shown in FIG. 3. The signal Latch2 is a signal to become H if the abnormality signal ALM2 is asserted. These signals Latch1 and Latch2 are supplied to the abnormality notification unit 300 and used for notification from the abnormality notification unit 300. As described above, the signals Latch1 and Latch2 correspond to the second abnormality position signal.

Both the signals Latch1 and Latch 2 are supplied to an OR gate OR1. The OR gate OR1 is an OR gate to produce an output H if the latch circuit 204 latches the second abnormality position signal as a signal indicating detection of an abnormality. In the absence of detection of an abnormality, the OR gate OR1 produces an output L. This output is applied to an input to the timer circuit 206 (NOR gate NOR1), and functions to permit start of the motion of the timer circuit 206 if an abnormality position signal indicating an abnormality is not latched. Specifically, once the latch circuit 204 latches an abnormality position signal indicating an abnormality, the timer circuit 206 does not start motion.

If an abnormality is once detected (once latched) in an electronic device, the electronic device basically becomes a target of inspection or fixing. Hence, latching abnormalities repeatedly without conducting inspection, etc. is basically beyond expectation. The output signal from the OR gate OR1 is inverted at an inverter INV1, and then used as a mask signal in the abnormal state detection circuit. This will be described in detail later.

[Abnormal State Detection Circuit 202]

The abnormal state detection circuit 202 masks an abnormality position signal (first abnormality position signal), and then supplies the masked abnormality position signal to the latch circuit 204. The first abnormality position signal is supplied to an NOR gate XOR1 and an XOR gate XOR2. Two first abnormality position signals (an output signal from the comparator Comp1 and an output signal from the comparator Comp2) are supplied to the XOR gate XOR1. If the output signal from the comparator Comp1 is H and the output signal from the comparator Comp2 is L, the NOR gate XOR1 produces an output H. Specifically, if the abnormality signal ALM1 is asserted, the XOR gate XOR1 produces an output signal H. The output signal from the comparator Comp2 as one of the first abnormality position signals and the ground (L) are supplied to the XOR gate NOR2. The NOR gate XOR2 produces an output signal H only if the output signal from the comparator Comp2 is H. Specifically, if the abnormality signal ALM2 is asserted, the NOR gate XOR2 produces an output signal H.

As described above, the first abnormality position signal is decomposed by the two XOR gates XOR1 and XOR2 into signals corresponding to abnormality signals. The signals resulting from the decomposition are called second abnormality position signals. The second abnormality position signals are masked by an AND gate AND1 and an AND gats AND2 using a mask signal, and then supplied to the latch circuit 204. As shown in FIG. 3, the mask signal becomes L if the latch circuit 204 latches a predetermined abnormality signal to disable an output signal from the abnormal state detection circuit 202 (second abnormality position signal). Disabling the output signal means setting the second abnormality position signal forcibly to L. An output signal from the AND gate AND1 and an output signal from the AND gate AND2 are the second abnormality position signals as described above, and these signals are to be latched by the latch circuit 204.

[Abnormality Notification Unit 300]

The abnormality notification unit 300 notifies a position where an abnormality has been detected (the abnormality signal ALM1 or ALM2 indicating detection of an abnormality) using the second abnormality position signal latched by the latch circuit 204. In the illustration of FIG. 3, an LED 1 (LED LED1) and an LED 2 (LED LED2) correspond to the abnormality signals ALM1 and ALM2 respectively, and the LED 1 or the LED 2 is turned on in response to the abnormality signal ALM1 or ALM2. If the signal Latch1 as one of the second abnormality position signals is H, a transistor 170 is turned on to cause a current to flow in the LED 1 through a resistor 172. As a result, the LED 1 is turned on to allow notification of the occurrence of an abnormality resulting in assertion of the abnormality signal ALM1 to a user, for example.

If the signal Latch2 as the other of the second abnormality position signals is H, a transistor 174 is turned on to cause a current to flow in the LED 2 through a resistor 176. As a result, the LED 2 is turned on to allow notification of the occurrence of an abnormality resulting in assertion of the abnormality signal ALM2 to a user, for example. While the LED 1 is used in the illustration of FIG. 3, notification may be given using a buzzer or a speaker, for example. Alternatively, a position where an abnormality has been detected may be presented on a display.

[4. Examples of Motion of Circuit Shown in FIG. 3]

Figure 4:
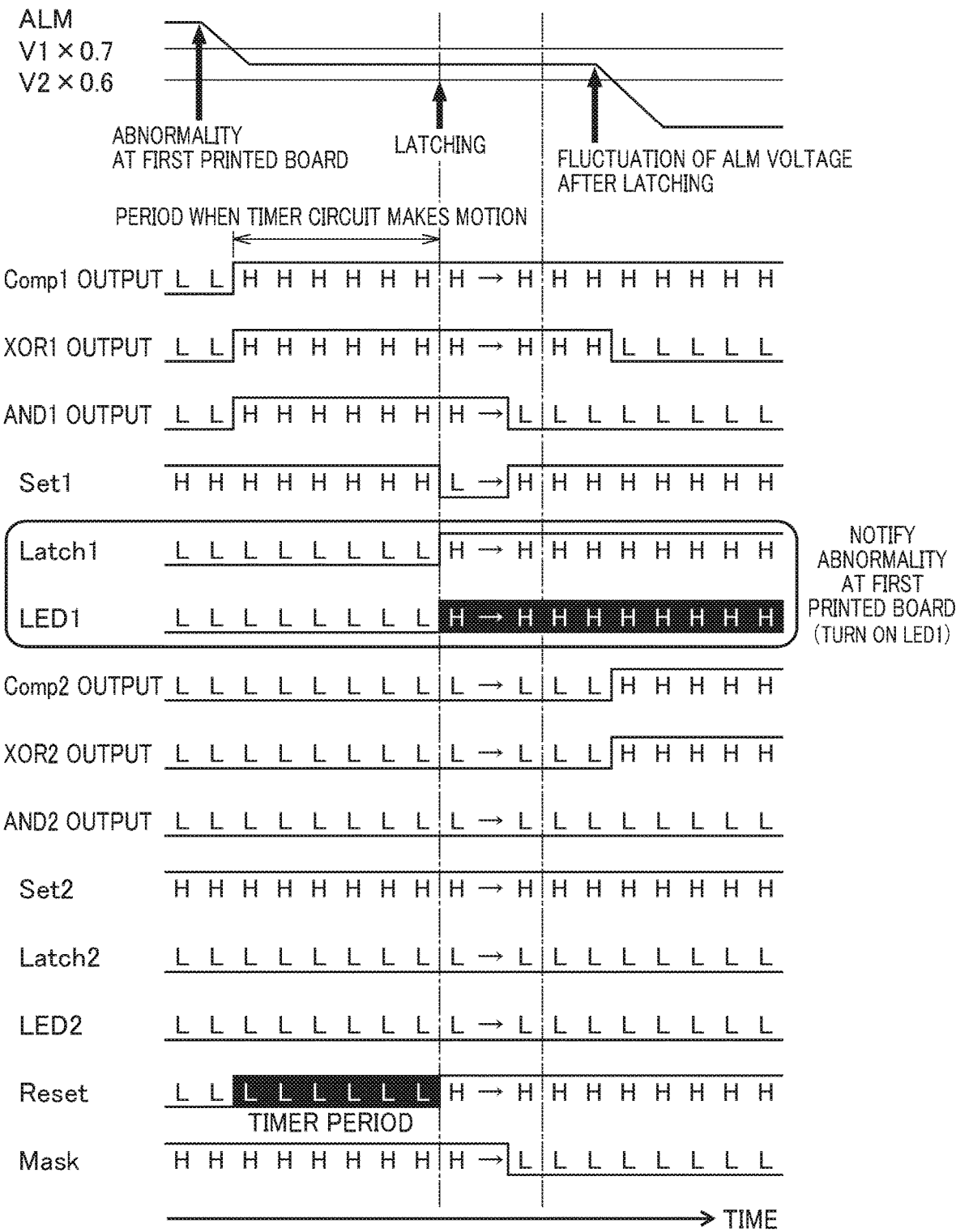
FIG. 4 is a state transition view showing a first example of the motion of the abnormality detector according to the embodiment of the present invention.

FIGS. 4 and 5 are state transition views (timing diagrams) each explaining motion responsive to detection of an abnormality. FIGS. 4 and 5 each show the names of signals at corresponding parts in the circuit of FIG. 3 and changes in the values of these signals. FIGS. 4 and 5 each show passage of time in a direction from left to right. An abnormality voltage signal shown in each of FIGS. 4 and 5 is a signal generated by wired-OR connecting the abnormality signals ALM1 and ALM2 and then converting a resultant signal to a voltage.

[First Example of Motion on the Occurrence of Abnormality (FIG. 4: Example Using First Printed Board 112a)]

Step 1:
An abnormality occurs at the first printed board 112a and the abnormality signal ALM1 is asserted.

Step 2:
The voltage of the abnormality signal resulting from the wired-OR connection is reduced. In the illustration of FIG. 4, the voltage falls below V1×0.7 and does not fall below V1×0.6.

Step 3:
When the abnormality signal resulting from the wired-OR connection falls below the initial detection threshold (V1× 0.7), the comparator Comp1 produces an output H and the timer circuit 206 starts motion.

Step 4:
After the timer circuit 206 completes the motion, the latch circuit 204 latches a state at the time of completion of the motion (an output from the abnormal state detection circuit 202).

Step 5:
After the latch circuit 204 completes the latching motion, an input to the timer circuit 206 is masked (the transistor 160 is turned off), and an output from the abnormal state detection circuit 202 is disabled (the output is forcibly set to L).

Step 6:
Even if a different abnormality (or power supply shut-off) occurs thereafter to cause fluctuation of the voltage of the state latched by the latch circuit 204 remains unchanged (is maintained).

Step 7:
The LED 1 is turned on based on the content of a latched abnormality position signal. The motion follows the foregoing flow. Thus, even if an initial abnormality occurs and a different abnormality occurs thereafter, the different abnormality becomes uninfluential.

[Second Example of Motion on the Occurrence of Abnormality (FIG. 5: Example Using Second Printed Board 112b)]

Step 1:
An abnormality occurs at the second printed board 112b and the abnormality signal ALM2 is asserted.

Step 2:
The voltage of the abnormality signal resulting from the wired-OR connection is reduced. In the illustration of FIG. 5, the voltage falls below V1×0.6.

Step 3:
When the abnormality signal resulting from the wired-OR connection fails below the initial detection threshold (V1× 0.7), the comparator Comp1 produces an output H and the timer circuit 206 starts motion. The abnormality signal resulting from the wired-OR connection further falls below the next detection threshold (V1×0.6), and the comparator Comp2 also produces an output H.

Step 4:
After the timer circuit 206 completes the motion, the latch circuit 204 latches a state at the time of completion of the motion (an output from the abnormal state detection circuit 202).

Step 5:
After the latch circuit 204 completes the latching motion, an input to the timer circuit 206 is masked (the transistor 160 is turned off), and an output from the abnormal state detection circuit 202 is disabled (the output is forcibly set to L).

Step 6:
Even if a different abnormality (or power supply shut-off) occurs thereafter to cause fluctuation of the voltage of the abnormality signal resulting from the wired-OR connection, the state latched by the latch circuit 204 remains unchanged (is maintained).

Step 7:
The LED 2 is turned on in response to the content of a latched abnormality position signal. The motion follows the foregoing flow. Thus, even if an initial abnormality occurs and a different abnormality occurs thereafter, the different abnormality becomes uninfluential.

[5. Conclusion]

(1) As described above, in this embodiment, abnormality signals (digital signals) from corresponding abnormality positions are wired-OR connected and converted to an analog signal, particularly, to a voltage signal. In this embodiment, this is achieved by providing resistors (output resistors) having resistances differing between the abnormality positions, and means (transistors) for producing low-level states (connections to the ground) through the corresponding resistors on the occurrences of abnormalities. Thus, in this embodiment, it becomes possible to identify an abnormality position by discriminating a voltage. Only a single signal line is required to achieve what is called reduced wiring. In this example, a voltage signal is described as an analog signal resulting from conversion. Meanwhile, other parameters resulting from conversion are applicable such as a current, a frequency, a phase, an amplitude, etc.

(2) According to the means provided in this embodiment, even if multiple abnormalities occur, an initial abnormality signal is latched after passage of the predetermined period from the occurrence of an abnormality, and a subsequent abnormality is masked. In this way, the abnormality signal (or an abnormality position signal, for example) is latched after passage of the predetermined period from the occurrence of the abnormality. This makes it possible to prevent erroneous detection due to noise. This also makes it possible to prevent the fluctuating voltage value of the voltage of an abnormality signal resulting from wired-OR connection caused by the subsequent occurrences of a second abnormality and a third abnormality from being detected (erroneously) during the fluctuation. Additionally, even if an initial abnormality occurs, and a second abnormality and a third abnormality occur thereafter, the second and third abnormalities can be masked. This makes it possible to identify only an initial abnormality signal without the need of providing any particular means for recording the position of an abnormality.

(3) The application of the abnormality detector 100 according to this embodiment is not particularly limited but the abnormality detector 100 is applicable to various electronic devices. The abnormality detector 100 may be provided in an electronic device or external to an electronic device. Further, part of the abnormality detector 100 may be provided in an electronic device.

(4) While the embodiment of the present invention has been described in detail above, this embodiment is merely a specific example employed for implementing the present invention. The technical scope of the present invention is not limited to the above-described embodiment. Various changes of the present invention can be devised within a range not departing from the substance of the invention. These changes are also covered by the technical scope of the present invention.

EXPLANATION OF REFERENCE NUMERALS

10, 110 Abnormality detection unit.
12*a*, 112*a* First printed board
12*b*, 112*b* Second printed board
12*c*, 112*c* Third printed board
12*d*, 112*d* Fourth printed board
20, 120 Abnormality notification printed board
22, 200 Abnormal state latch unit
24, 300 Abnormality notification unit
100 Abnormality detector
114 Abnormality voltage signal generation circuit
116 Voltage monitor circuit
150*a*, 150*b*, 150*c*, 150*d* Transistor
152*a*, 152*b*, 152*c*, 152*d* Resistor
154 Pull-up resistor
156*a*, 156*b* Pull-up resistor
158 Constant current source
160, 166, 170, 174 Transistor
162 Capacitor
164 Pull-up resistor
168, 172, 176 Resistor
202 Abnormal state detection circuit
204 Latch circuit
206 Timer circuit
AND1, AND2 AND gate
Comp1, Comp2, Comp3 Comparator
INV1 Inverter
LED1, LED2 LED
NAND1, NAND2, NAND3, NAND4, NAND5, NAND6 NAND gate
NOR1 NOR gate
OR1 OR gate

What is claimed is:

1. An abnormality detector for an electronic device comprising: an abnormality detection unit that outputs an abnormality position signal for identifying an abnormality position on the occurrence of an abnormality at the electronic device; an abnormal state latch unit that latches the abnormality position signal; and an abnormality notification unit that notifies the abnormality based on the latched abnormality position signal, wherein the abnormality detection unit comprises:
an abnormality voltage signal generation circuit that converts abnormality signals indicating the occurrences of abnormalities at predetermined abnormality positions to voltages differing between the abnormality positions to generate abnormality voltage signals that correspond to respective abnormality positions; and
a voltage monitor circuit that monitors the abnormality voltage signals generated by the abnormality voltage signal generation circuit, and outputs the abnormality position signal for identifying the abnormality position based on the voltages corresponding to the abnormality voltage signals, the abnormal state latch unit comprises:
an abnormal state detection circuit that masks the abnormality position signal;
a timer circuit that starts motion when the abnormality position signal indicates the occurrence of an abnormality based on the abnormality position signal, and completes the motion and outputs a reset signal after passage of a predetermined period; and
a latch circuit that latches the abnormality position signal output from the abnormal state detection circuit when the reset signal is output, the abnormal state detection circuit masks the abnormality position signal when the latch circuit makes latching motion to disable an output from the abnormal state detection circuit, the timer circuit masks an input to the timer circuit when the latch circuit makes the latching motion to maintain a state indicating completion of the motion, and the abnormality voltage signals that correspond to the respective abnormality positions generated by the abnormality voltage signal generation circuit are wired-OR connected and supplied through a single signal line to the voltage monitor circuit.

2. The abnormality detector for an electronic device according to claim 1, wherein the abnormality voltage signal generation circuit comprises:
an inspection target printed board unit provided at a printed board as an abnormality inspection target; and
an abnormality notification printed board unit provided at an abnormality notification printed board to notify an abnormality,
the inspection target printed board unit comprises:
output resistors having resistances differing between the abnormality signals; and
switch circuits for making electrical conductions between the output resistors and the ground if the abnormality signals are on, and
the abnormality notification printed board unit comprises a pull-up resistor connected between the output resistors arranged at the printed board as an inspection target and a power supply voltage.

3. The abnormality detector for an electronic device according to claim 1, wherein, if an input filter is provided for removal of noise from the abnormality signals, the predetermined period is longer than time constant of the input filter.

4. The abnormality detector for an electronic device according to claim 1, wherein, if the electronic device is to be powered off based on the abnormality signals, the predetermined period is shorter than a period from when the abnormality signals are switched on to when the electronic signal is powered off.

5. The abnormality detector for an electronic device according to claim 1, wherein the abnormality notification unit comprises a light-emitting unit to be turned on corresponding to each abnormality position and based on the latched abnormality position signal.

6. The abnormality detector for an electronic device according to claim 1, wherein the abnormality notification unit comprises a display unit to display an abnormality position based on the latched abnormality position signal.

* * * * *